United States Patent
Tsao et al.

(10) Patent No.: US 12,463,192 B2
(45) Date of Patent: Nov. 4, 2025

(54) METHOD OF FORMING INTEGRATED CIRCUIT PACKAGES BY BONDING PACKAGE COMPONENT HAVING FIRST CARRIER TO PACKAGE SUBSTRATE HAVING SECOND CARRIER

(71) Applicant: Taiwan Semiconductor Manufacturing Co., Ltd., Hsinchu (TW)

(72) Inventors: Pei-Haw Tsao, Tai-chung (TW); Chien-Li Kuo, Hsinchu (TW); Kuo-Chio Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 787 days.

(21) Appl. No.: 17/828,310

(22) Filed: May 31, 2022

(65) Prior Publication Data
US 2023/0387101 A1 Nov. 30, 2023

(51) Int. Cl.
*H01L 25/00* (2006.01)
*H01L 21/56* (2006.01)
*H01L 21/60* (2006.01)

(52) U.S. Cl.
CPC ............ *H01L 25/50* (2013.01); *H01L 21/56* (2013.01); *H01L 21/60* (2021.08); *H01L 2021/6006* (2013.01)

(58) Field of Classification Search
CPC ......... H01L 25/50; H01L 25/60; H01L 25/56; H01L 2021/6006
See application file for complete search history.

(56) References Cited

U.S. PATENT DOCUMENTS

| | | | |
|---|---|---|---|
| 8,993,380 B2 | 3/2015 | Hou et al. | |
| 9,064,879 B2* | 6/2015 | Hung | H01L 24/96 |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2009/0200662 A1* | 8/2009 | Ng | H01L 24/97 |
| | | | 257/E23.116 |

(Continued)

*Primary Examiner* — Lex H Malsawma
(74) *Attorney, Agent, or Firm* — Slater Matsil, LLP

(57) ABSTRACT

A method of forming an integrated circuit package includes: attaching a first carrier to a package component, the package component including: an interposer; a first semiconductor die attached to a first side of the interposer; a second semiconductor die attached to the first side of the interposer; an encapsulant encapsulating the first semiconductor die and the second semiconductor die; and conductive connectors attached to a second side of the interposer; attaching a second carrier to a package substrate, the package substrate including bond pads; bonding the conductive connectors of the package component to the bond pads of the package substrate by reflowing the conductive connectors while the first carrier is attached to the package component and while the second carrier is attached to the package substrate; removing the first carrier; and removing the second carrier.

20 Claims, 15 Drawing Sheets

(56) References Cited

U.S. PATENT DOCUMENTS

| | | | |
|---|---|---|---|
| 2016/0322323 A1* | 11/2016 | Lai | H01L 24/14 |
| 2019/0148317 A1 | 5/2019 | Tsao et al. | |
| 2020/0357770 A1* | 11/2020 | Chiang | H01L 24/49 |
| 2021/0098382 A1* | 4/2021 | Lin | H01L 21/4857 |
| 2021/0327866 A1* | 10/2021 | Yu | H01L 24/83 |
| 2021/0366871 A1 | 11/2021 | Ko et al. | |
| 2023/0197679 A1* | 6/2023 | Ecton | H01L 23/5383 |
| | | | 257/668 |
| 2023/0352441 A1* | 11/2023 | Milo | H01L 24/11 |

* cited by examiner

METHOD OF FORMING INTEGRATED CIRCUIT PACKAGES BY BONDING PACKAGE COMPONENT HAVING FIRST CARRIER TO PACKAGE SUBSTRATE HAVING SECOND CARRIER

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a tendency for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
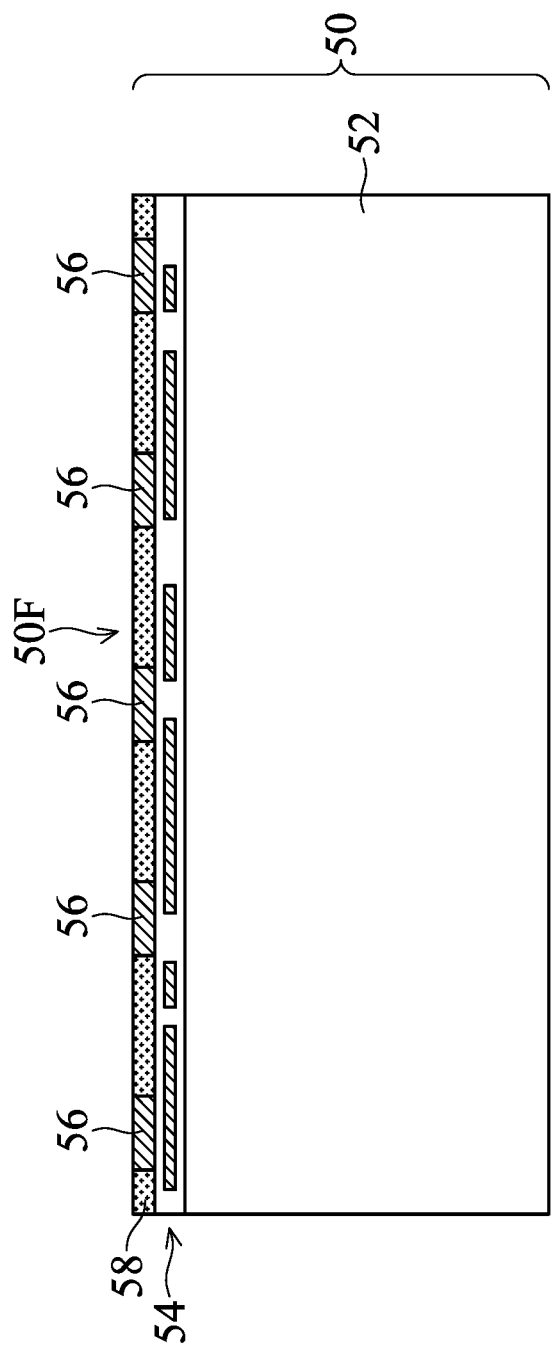
FIG. 1 is a cross-sectional view of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, an integrated circuit package is assembled by bonding a package component to a package substrate. Formation of the package component may include one or more attachments of integrated circuit devices to a wafer (e.g., an interposer) and embedding the integrated circuit devices in an encapsulant. The integrated circuit devices, encapsulant, and wafer may have differing coefficients of thermal expansion (CTEs), which make the package component vulnerable to warpage or curvature during thermal processes, such as during subsequent bonding of the package component to the package substrate. During the bonding, the package component is attached to a first carrier and the package substrate is attached to a second carrier. Attaching the package component to a first carrier and the package substrate to a second carrier helps reduce warpage in the package component and in the package substrate during the bonding process. After the bonding process, the first carrier and the second carrier may be removed, resulting in minimal additional warpage or curvature of the components of the integrated circuit package (e.g., the package component and the package substrate). As a result, the integrated circuit package may be assembled at increased yield and may have improved performance and reliability.

Figure 4:
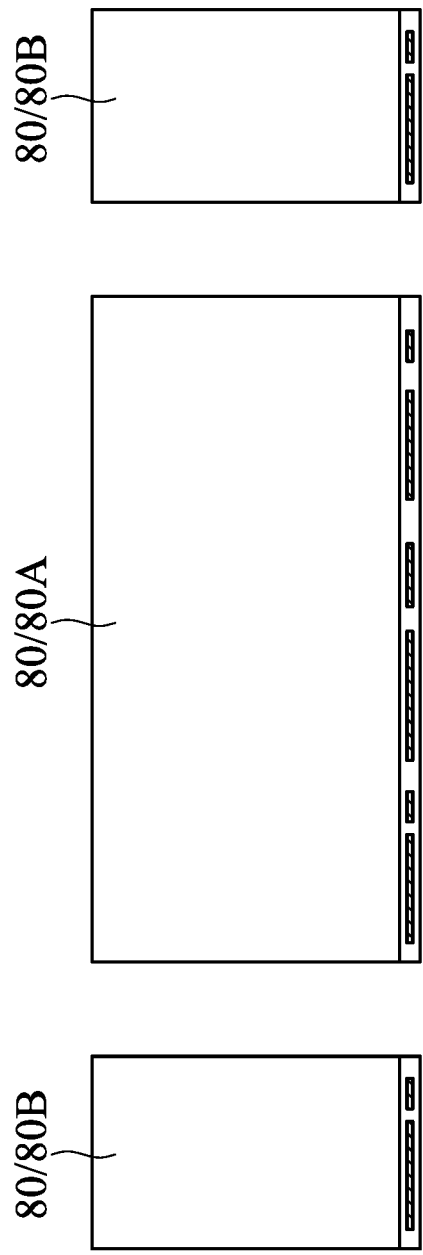

FIG. 1 is a cross-sectional view of an exemplary integrated circuit die 50. Multiple integrated circuit dies 50 (e.g., integrated circuit devices 80, as shown in FIG. 4) will be packaged in subsequent processing to form package components 150 and further assembled into integrated circuit packages 250. Each integrated circuit die 50 may be a logic die (e.g., central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, an interface die, a sensor die, a micro-electro-mechanical-system (MEMS) die, a signal processing die (e.g., digital signal processing (DSP) die), a front-end die (e.g., analog front-end (AFE) dies), the like, or combinations thereof (e.g., a system-on-a-chip (SoC) die). The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and a dielectric layer 58.

The semiconductor substrate 52 may be a substrate of silicon, doped or undoped, or an active layer of a semiconductor-on-insulator (SOI) substrate (e.g., silicon or silicon germanium). The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward in FIG. 1) and an inactive surface (e.g., the surface facing downward in FIG. 1). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52, and is used to electrically connect the devices of the semiconductor substrate 52 to form an integrated circuit. The interconnect structure 54 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layer(s) may include conductive vias and/or conductive lines to interconnect the devices of the semiconductor substrate 52. The metallization layer(s) may be formed of a conductive material, such as a metal, such as copper, cobalt, aluminum, gold, combinations thereof, or the like. The interconnect structure 54 may be formed by a damascene process, such as a single damascene process, a dual damascene process, or the like.

Die connectors 56 are at the front side 50F of the integrated circuit die 50. The die connectors 56 may be conductive pillars, pads, or the like, to which external connections are made. The die connectors 56 are in and/or on the interconnect structure 54. For example, the die connectors 56 may be part of an upper metallization layer of the interconnect structure 54. The die connectors 56 can be formed of a metal, such as copper, aluminum, or the like, and can be formed by, for example, plating, or the like.

Optionally, solder regions (not specifically illustrated) are disposed on the die connectors 56 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 56. Chip probe testing may be performed on the integrated circuit die 50 to ascertain whether the integrated circuit die 50 is a known good die (KGD). Thus, only integrated circuit dies 50, which are KGDs, undergo subsequent processing are packaged, and dies which fail the chip probe testing are not packaged. After testing, the solder regions may be removed in subsequent processing steps.

A dielectric layer 58 is at the front side 50F of the integrated circuit die 50. The dielectric layer 58 is in and/or on the interconnect structure 54. For example, the dielectric layer 58 may be an upper dielectric layer of the interconnect structure 54. The dielectric layer 58 laterally surrounds the die connectors 56. The dielectric layer 58 may be an oxide, a nitride, a carbide, a polymer, the like, or a combination thereof. The dielectric layer 58 may be formed, for example, by spin coating, lamination, chemical vapor deposition (CVD), or the like. Initially, the dielectric layer 58 may bury the die connectors 56, such that the top surface of the dielectric layer 58 is above the top surfaces of the die connectors 56. The die connectors 56 may be exposed through the dielectric layer 58 during formation of the integrated circuit die 50. Exposing the die connectors 56 may remove any solder regions that may be present on the die connectors 56. A removal process can be applied to the various layers to remove excess materials over the die connectors 56. The removal process may be a planarization process such as a chemical mechanical polish (CMP), an etch-back, combinations thereof, or the like. After the planarization process, top surfaces of the die connectors 56 and the dielectric layer 58 are substantially coplanar (within process variations) and are exposed at the front side 50F of the integrated circuit die 50.

Figure 2A:
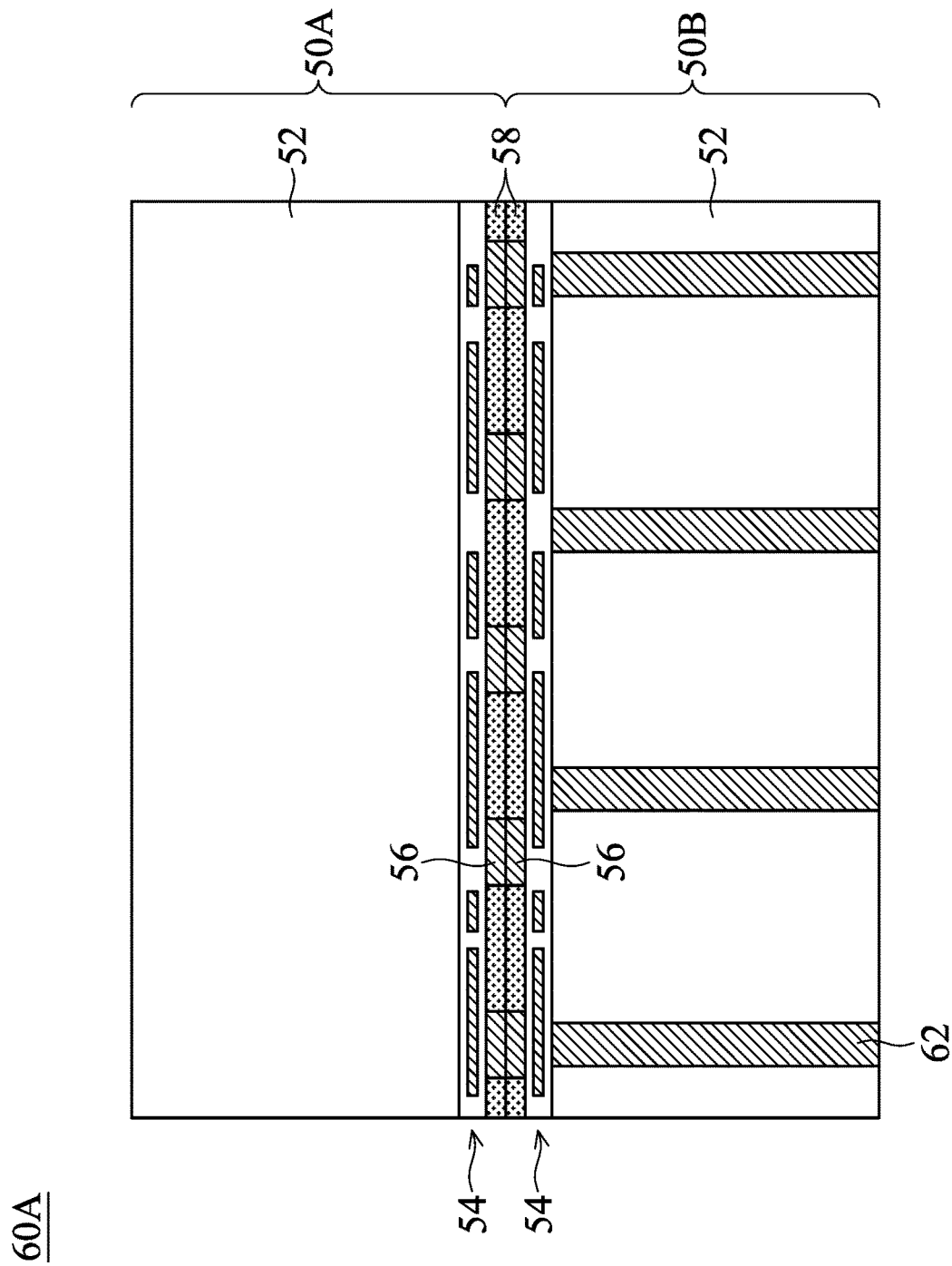
FIGS. 2A-2B are cross-sectional views of die stacks, in accordance with some embodiments.
Figure 2B:
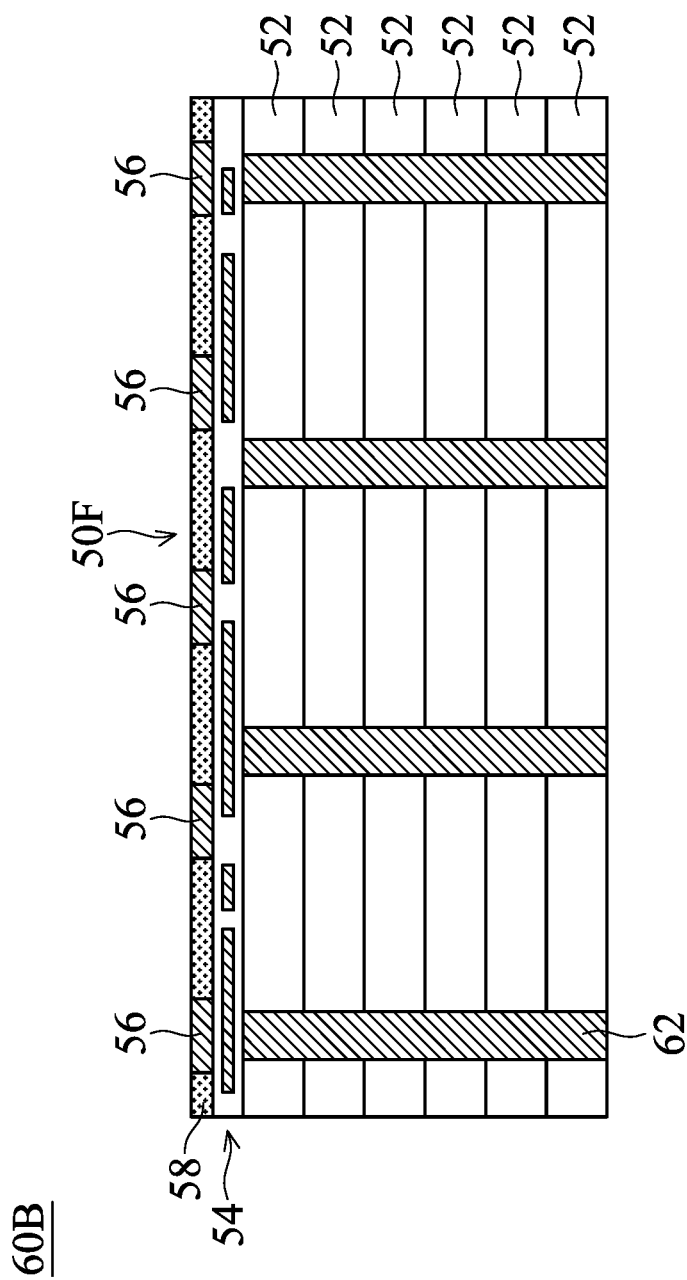

FIGS. 2A-2B are cross-sectional views of die stacks 60A, 60B, in accordance with some embodiments. The die stacks 60A, 60B may each have a single function (e.g., a logic device, memory die, etc.), or may have multiple functions. In some embodiments, the die stack 60A is a logic device such as a system-on-integrated-chip (SoIC) device and the die stack 60B is a memory device such as high bandwidth memory (HBM) device.

As shown in FIG. 2A, the die stack 60A includes two bonded integrated circuit dies 50 (e.g., a first integrated circuit die 50A and a second integrated circuit die 50B). In some embodiments, the first integrated circuit die 50A is a logic die, and the second integrated circuit die 50B is an interface die. The interface die bridges the logic die to memory dies, and translates commands between the logic die and the memory dies. In some embodiments, the first integrated circuit die 50A and the second integrated circuit die 50B are bonded such that the active surfaces are facing each other (e.g., are "face-to-face" bonded). Conductive vias 62 may be formed through one of the integrated circuit dies 50 so that external connections may be made to the die stack 60A. The conductive vias 62 may be through-substrate vias (TSVs), such as through-silicon vias or the like. In the embodiment shown, the conductive vias 62 are formed in the second integrated circuit die 50B (e.g., the interface die). The conductive vias 62 extend through the semiconductor substrate 52 of the respective integrated circuit die 50, to be physically and electrically connected to the metallization layer(s) of the interconnect structure 54.

As shown in FIG. 2B, the die stack 60B may be a stacked device that includes multiple semiconductor substrates 52. For example, the die stack 60B may be a memory device that includes multiple memory dies such as a hybrid memory cube (HMC) device, a high bandwidth memory (HBM) device, or the like. Each of the semiconductor substrates 52 may (or may not) have a separate interconnect structure 54. The semiconductor substrates 52 are connected by conductive vias 62.

FIGS. 3-9 are cross-sectional views of intermediate stages in the manufacturing of a package component 150, in accordance with some embodiments. Specifically, the package component 150 is formed by bonding integrated circuit devices 80 to a wafer 70. FIGS. 10-13 are cross-sectional views of intermediate stages in the bonding process of the package component 150 to a package substrate 200 as part of the assembly of an integrated circuit package 250. In an embodiment, the integrated circuit package 250 is a chip-on-wafer-on-substrate (CoWoS) package, wherein the package component 150 is a chip-on-wafer (CoW) component and the package substrate 200 is the substrate (S). Although, it should be appreciated that embodiments may be applied to other three-dimensional integrated circuit (3DIC) packages, such as SoIC packages.

Figure 3:
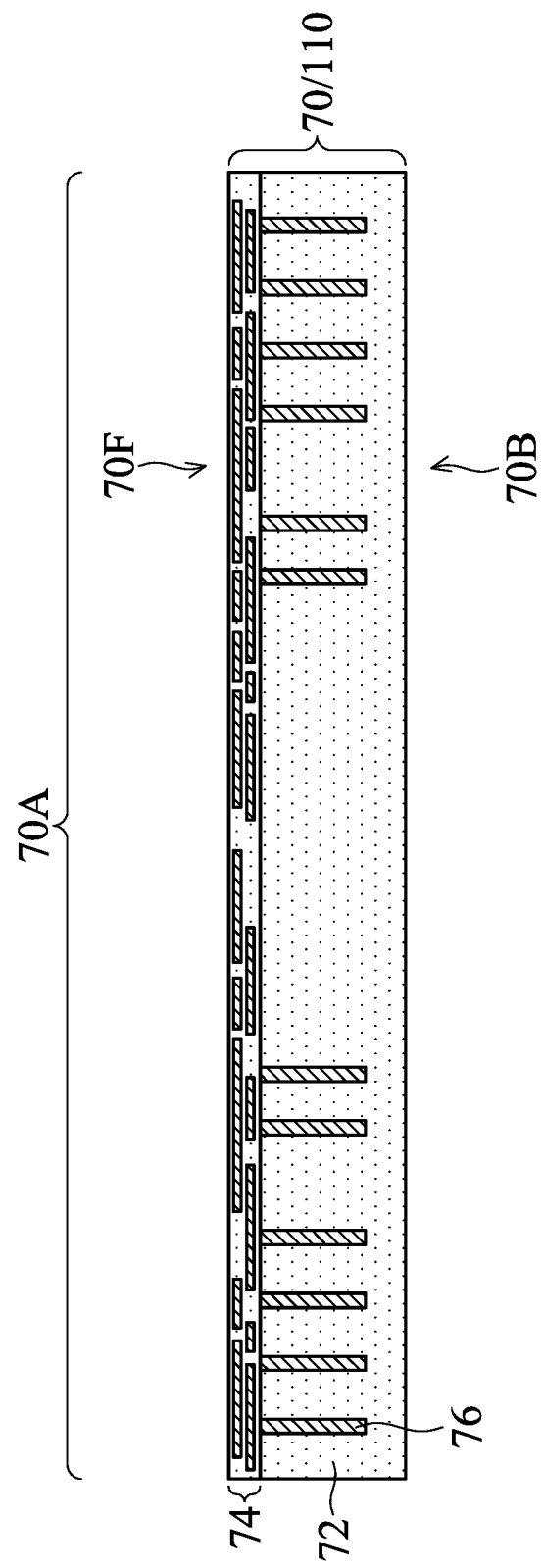
FIGS. 3-13 are cross-sectional views of intermediate stages in the manufacturing of an integrated circuit package, in accordance with some embodiments.

In FIG. 3, a wafer 70 is obtained or formed. The wafer 70 has one or more package regions 70A, each of which includes devices formed therein. One or more integrated circuit devices 80 (see FIG. 4) will be attached to the package regions 70A in subsequent processing to form the package component 150, which will be singulated so that each singulated package component 150 includes a package region 70A of the wafer 70 and the integrated circuit devices 80.

Processing of one package region 70A of the wafer 70 is illustrated. It should be appreciated that any number of package regions 70A of a wafer 70 can be simultaneously processed and singulated to form multiple package components 150 from the singulated portions of the wafer 70.

The wafer 70 comprises devices in each of the package regions 70A, which will be singulated in subsequent processing to be included in the package component 150. For example, the wafer 70 may include devices such as interposers, integrated circuits dies (not specifically illustrated), or the like. In some embodiments, interposers 110 are formed in the wafer 70, which include a substrate 72, an interconnect structure 74, and conductive vias 76.

The substrate 72 may be a bulk semiconductor substrate, a semiconductor-on-insulator (SOI) substrate, a multi-layered semiconductor substrate, or the like. The substrate 72 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 72 may be doped or undoped. In embodiments where interposers are formed in the wafer 70, the substrate 72 generally does not include active devices therein, although the interposers may include passive devices formed in and/or on a front surface (e.g., the surface facing upward in FIG. 3) of the substrate 72. In embodiments where integrated circuits devices are formed in the wafer 70, active devices such as transistors, capacitors, resistors, diodes, and the like, may be formed in and/or on the front surface of the substrate 72.

The interconnect structure 74 is over the front surface of the substrate 72, and is used to electrically connect the devices (if any) of the substrate 72. The interconnect structure 74 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layer(s) may include conductive vias and/or conductive lines to interconnect any devices together and/or to an external device. The metallization layer(s) may be formed of a conductive material, such as a metal, such as copper, cobalt, aluminum, gold, combinations thereof, or the like. The interconnect structure 74 may be formed by a damascene process, such as a single damascene process, a dual damascene process, or the like.

In some embodiments, die connectors and a dielectric layer (not separately illustrated) are at the front side 70F of the wafer 70. Specifically, the wafer 70 may include die connectors and a dielectric layer that are similar to those of the integrated circuit die 50 described above. For example, the die connectors and the dielectric layer may be part of an upper metallization layer of the interconnect structure 74.

The conductive vias 76 extend into the interconnect structure 74 and/or the substrate 72. The conductive vias 76 are electrically connected to metallization layer(s) of the interconnect structure 74. The conductive vias 76 are also sometimes referred to as through vias, such as TSVs. As an example to form the conductive vias 76, recesses can be formed in the interconnect structure 74 and/or the substrate 72 by, for example, etching, milling, laser techniques, a combination thereof, and/or the like. A thin barrier layer may be conformally deposited in the recesses, such as by CVD, atomic layer deposition (ALD), physical vapor deposition (PVD), thermal oxidation, a combination thereof, and/or the like. The barrier layer may be formed of an oxide, a nitride, a carbide, combinations thereof, or the like. A conductive material may be deposited over the barrier layer and in the recesses. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the interconnect structure 74 or the substrate 72 by, for example, a CMP. Remaining portions of the barrier layer and conductive material form the conductive vias 76.

In FIG. 4, integrated circuit devices 80 (e.g., a first integrated circuit device 80A and a plurality of second integrated circuit devices 80B) are obtained or formed. The integrated circuit devices 80 may be embodiments of the integrated circuit dies 50 (see FIG. 1) or die stacks 60 of the integrated circuit dies 50 (see FIGS. 2A-2B). As such, the integrated circuit devices 80 may include the features of the integrated circuit dies 50 and the die stacks 60 described above, even though some of those features may not be illustrated with the integrated circuit devices 80. The integrated circuit devices 80 will be attached to the wafer 70. For example, a desired type and quantity of the integrated circuit devices 80 will be attached in the package region 70A of the wafer 70.

In some embodiments, the first integrated circuit device 80A may be a different type of devices and have a different function from the second integrated circuit devices 80B. The first integrated circuit device 80A may be a logic device, such as a central processing unit (CPU), graphics processing unit (GPU), system-on-a-chip (SoC), microcontroller, or the like. The first integrated circuit device 80A may be an integrated circuit die (e.g., the integrated circuit die 50 described for FIG. 1) or may be a die stack (e.g., the die stack 60A described for FIG. 2A). The second integrated circuit devices 80B may include a memory device, such as a dynamic random access memory (DRAM) die, static random access memory (SRAM) die, hybrid memory cube (HMC) module, a high bandwidth memory (HBM) module, the like, or combinations thereof. The second integrated circuit devices 80B may be integrated circuit dies (e.g., the integrated circuit dies 50 described for FIG. 1) or may be die stacks (e.g., the die stacks 60B described for FIG. 2B). The first integrated circuit device 80A and the second integrated circuit devices 80B may be formed in processes of a same technology node, or may be formed in processes of different technology nodes. For example, the first integrated circuit device 80A may be of a more advanced process node than the second integrated circuit devices 80B.

Figure 5:
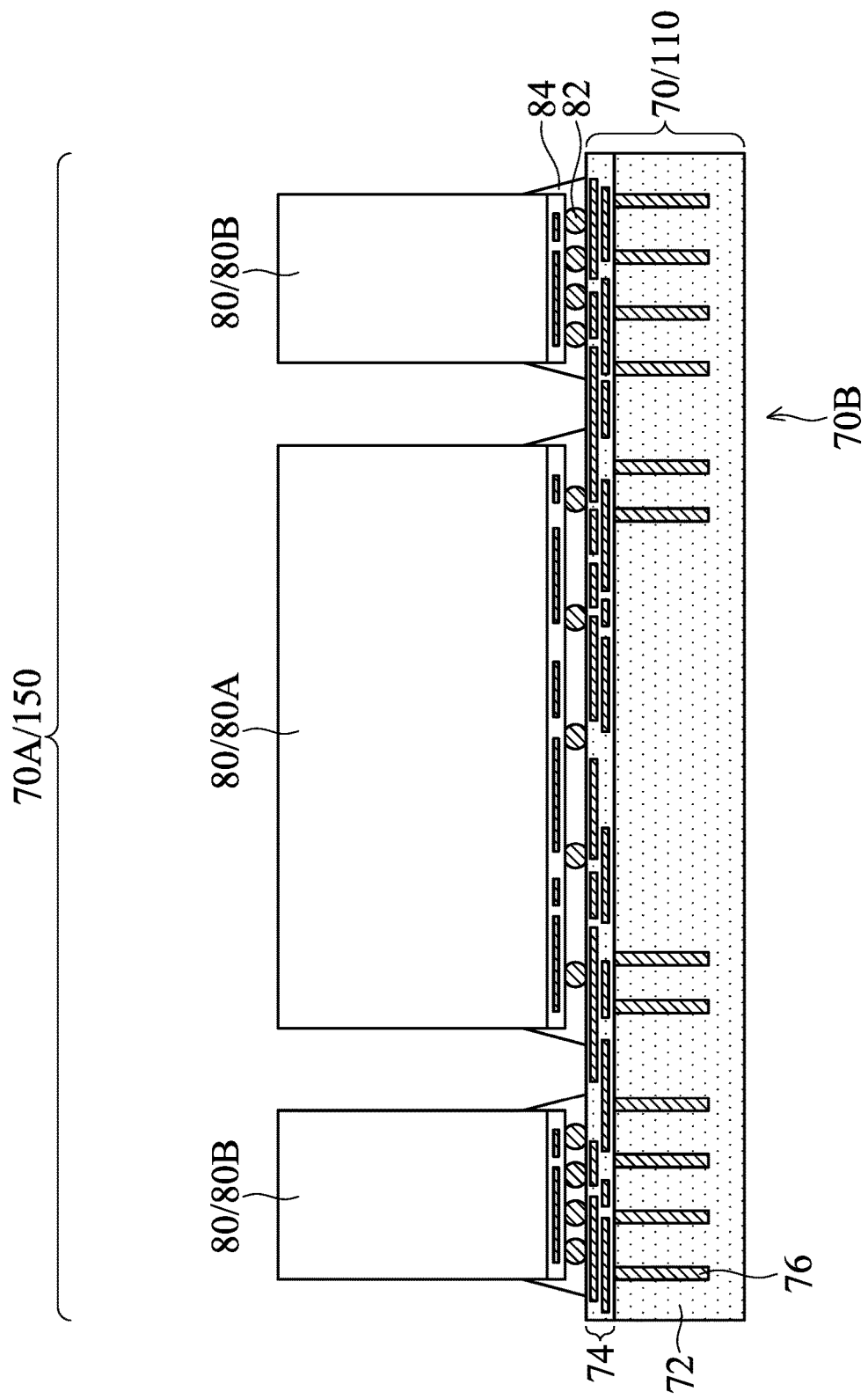

In FIG. 5, the integrated circuit devices 80 are attached to the wafer 70 with solder bonds, such as with conductive connectors 82. The integrated circuit devices 80 may be placed on the interconnect structure 74 using, e.g., a pick-and-place tool. The conductive connectors 82 may be formed of a conductive material that is reflowable, such as solder, copper, aluminum, gold, nickel, silver, palladium, tin, the like, or a combination thereof. In some embodiments, the conductive connectors 82 are formed by initially forming a layer of solder through methods such as evaporation, electroplating, printing, solder transfer, ball placement, or the like. Once a layer of solder has been formed on the structure, a reflow may be performed in order to shape the conductive connectors 82 into desired bump shapes. Attaching the integrated circuit devices 80 to the wafer 70 may include placing the integrated circuit devices 80 on the wafer 70 and reflowing the conductive connectors 82. The conductive connectors 82 form joints between corresponding die connectors of the wafer 70 and the integrated circuit devices 80, electrically connecting the interposer 110 to the integrated circuit devices 80.

An underfill 84 may be formed around the conductive connectors 82, and between the wafer 70 and the integrated circuit devices 80. The underfill 84 may reduce stress and protect the joints resulting from the reflowing of the conductive connectors 82. The underfill 84 may be formed of an underfill material such as a molding compound, epoxy, or the like. The underfill 84 may be formed by a capillary flow process after the integrated circuit devices 80 are attached to the wafer 70, or may be formed by a suitable deposition method before the integrated circuit devices 80 are attached to the wafer 70. The underfill 84 may be applied in liquid or semi-liquid form and then subsequently cured.

In other embodiments (not specifically illustrated), the integrated circuit devices 80 are attached to the wafer 70 with direct bonds, for example, similarly as discussed above in connection with the die stacks 60. For example, hybrid bonding, fusion bonding, dielectric bonding, metal bonding, or the like may be used to directly bond corresponding dielectric layers and/or die connectors of the wafer 70 and the integrated circuit devices 80 without the use of adhesive or solder. The underfill 84 may be omitted when direct bonding is used. Further, a mix of bonding techniques could be used, e.g., some integrated circuit devices 80 could be attached to the wafer 70 by solder bonds, and other integrated circuit devices 80 could be attached to the wafer 70 by direct bonds.

Figure 6:
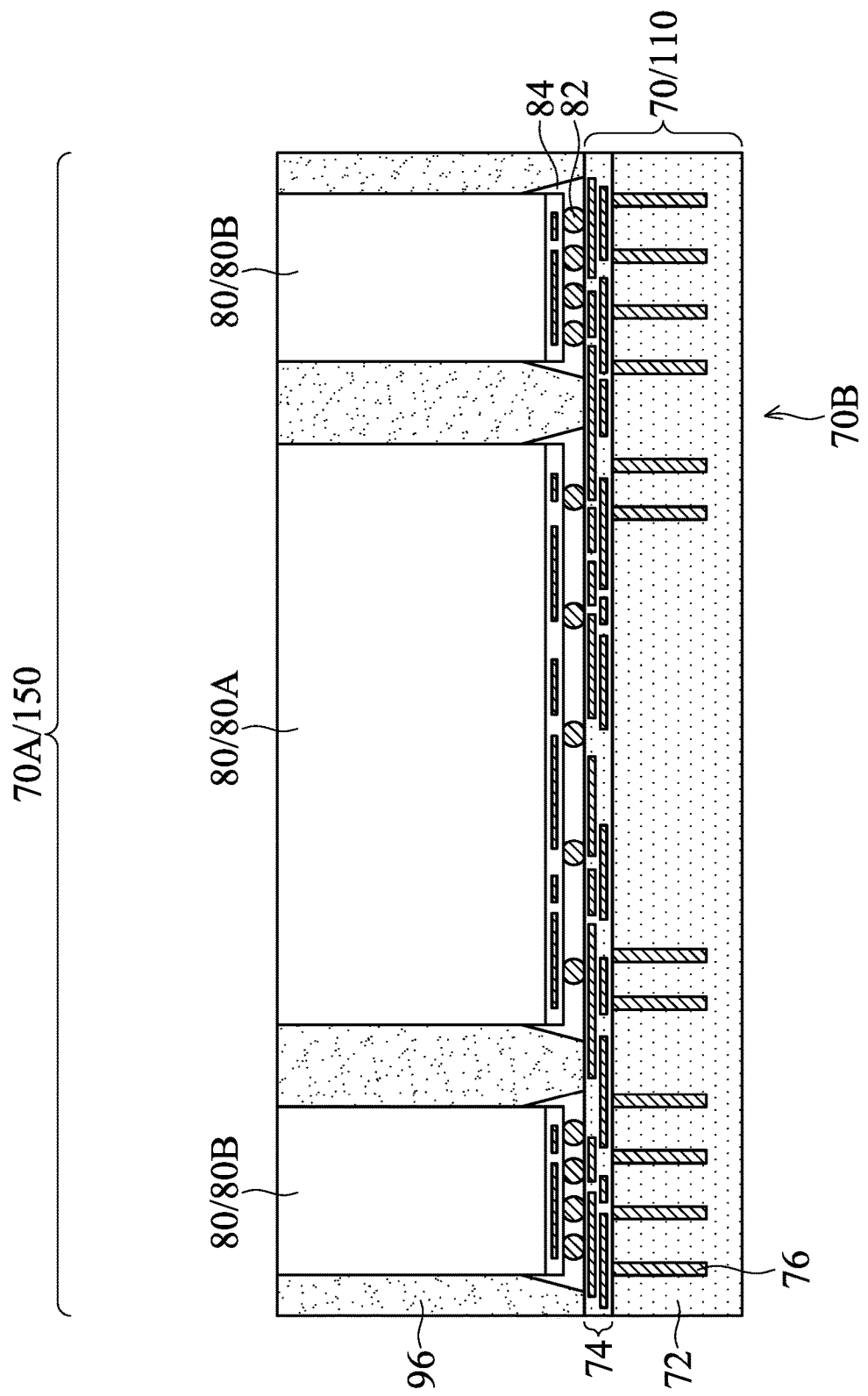

In FIG. 6, an encapsulant 96 is formed on and around the various components. After formation, the encapsulant 96 encapsulates the integrated circuit devices 80 and the underfill 84 (if present). The encapsulant 96 may be a molding compound, epoxy, or the like. The encapsulant 96 may be applied by compression molding, transfer molding, or the like, and is formed over the wafer 70 such that the integrated circuit devices 80 are buried or covered. The encapsulant 96 is further formed in gap regions between the integrated circuit devices 80. The encapsulant 96 may be applied in liquid or semi-liquid form and then subsequently cured.

In accordance with some embodiments, the encapsulant 96 is thinned to expose the first integrated circuit device 80A and the second integrated circuit devices 80B. The thinning process may be a grinding process, a chemical-mechanical polish (CMP), an etch-back, combinations thereof, or the like. After the thinning process, the top surfaces of the first integrated circuit device 80A, the second integrated circuit devices 80B, and the encapsulant 96 are substantially coplanar (within process variations). The thinning is performed until a desired amount of the first integrated circuit device 80A, the second integrated circuit devices 80B, and the encapsulant 96 has been removed.

Figure 7:
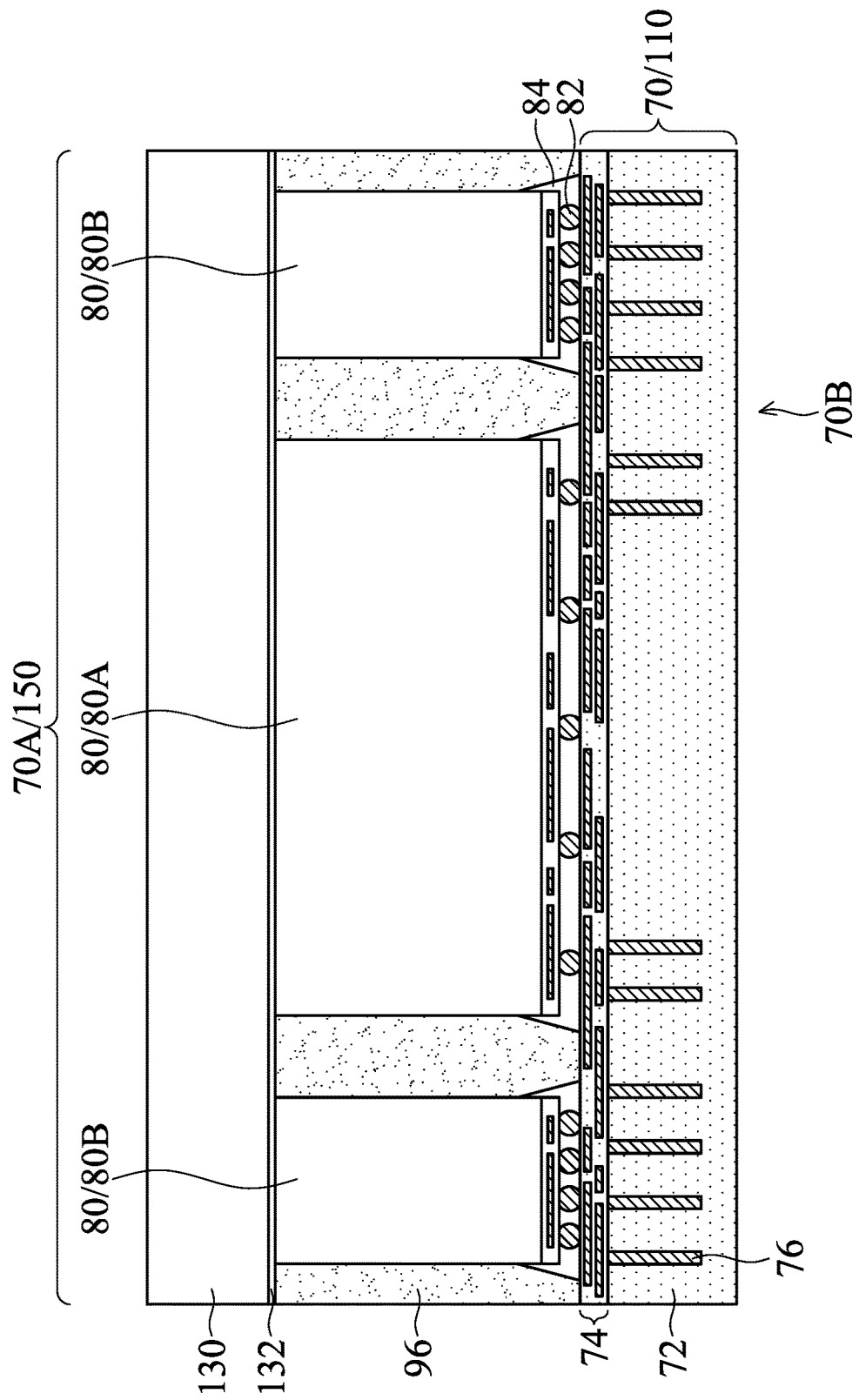

In FIG. 7, the package component 150 may be flipped over (not specifically illustrated) to prepare for processing of the back side 70B of the wafer 70. The package component 150 is then attached to a package carrier 130 as a support structure to reduce warpage and expansion of the package component 150 during the subsequent processing steps, including attachment of the package component 150 to a package substrate 200 (see FIGS. 10-13). For example, the package carrier 130 may be attached by a release layer 132 along the package component 150 proximal to the integrated circuit devices 80 and the encapsulant 96. The release layer 132 may be formed of a polymer-based material, which may be removed along with the package carrier 130 from the package component 150 after processing. In some embodiments, the package carrier 130 is a substrate such as a bulk semiconductor or a glass substrate. In some embodiments, the release layer 132 is a laser- and/or thermal-release material, which loses its adhesive property when exposed to certain wavelengths of light and/or heated, such as a light-to-heat-conversion (LTHC) release coating. For example, the release layer 132 may comprise an epoxy, a polyimide, an acrylic, the like, in an acetate and/or alcohol solvent, for example, or a suitable material. For example, the release layer 132 may be formed from a mixture of an acrylic within a solvent of 1-methoxy-2-propyl acetate and 2-butoxy ethanol, as created by 3M™ for LTHC properties. In some embodiments (not specifically illustrated), the package component 150 is held in place against the package carrier 130 using a vacuum or pressure seal without the release layer 132.

As discussed above, differing CTEs among the elements of the package component 150 may contribute to warpage during subsequent processing steps. In some embodiments, the first integrated circuit device 80A may have an effective CTE ranging from 3 ppm/K to 10 ppm/K, the second integrated circuit devices 80B may each have an effective CTE ranging from 5 ppm/K to 15 ppm/K, the encapsulant 96 may have a CTE ranging from 10 ppm/K to 50 ppm/K, and the wafer 70 may have an effective CTE ranging from 2 ppm/K to 10 ppm/K. For example, the package carrier 130 may be selected to have an effective CTE within the range of CTEs for these elements of the package component 150. In accordance with some embodiments, the package carrier 130 is selected to have an effective CTE within 5% to 30%, plus or minus, of an effective CTE of the package component 150. In some embodiments, the CTE for the package carrier 130 is greater than the effective CTE of the package component 150.

Figure 8:
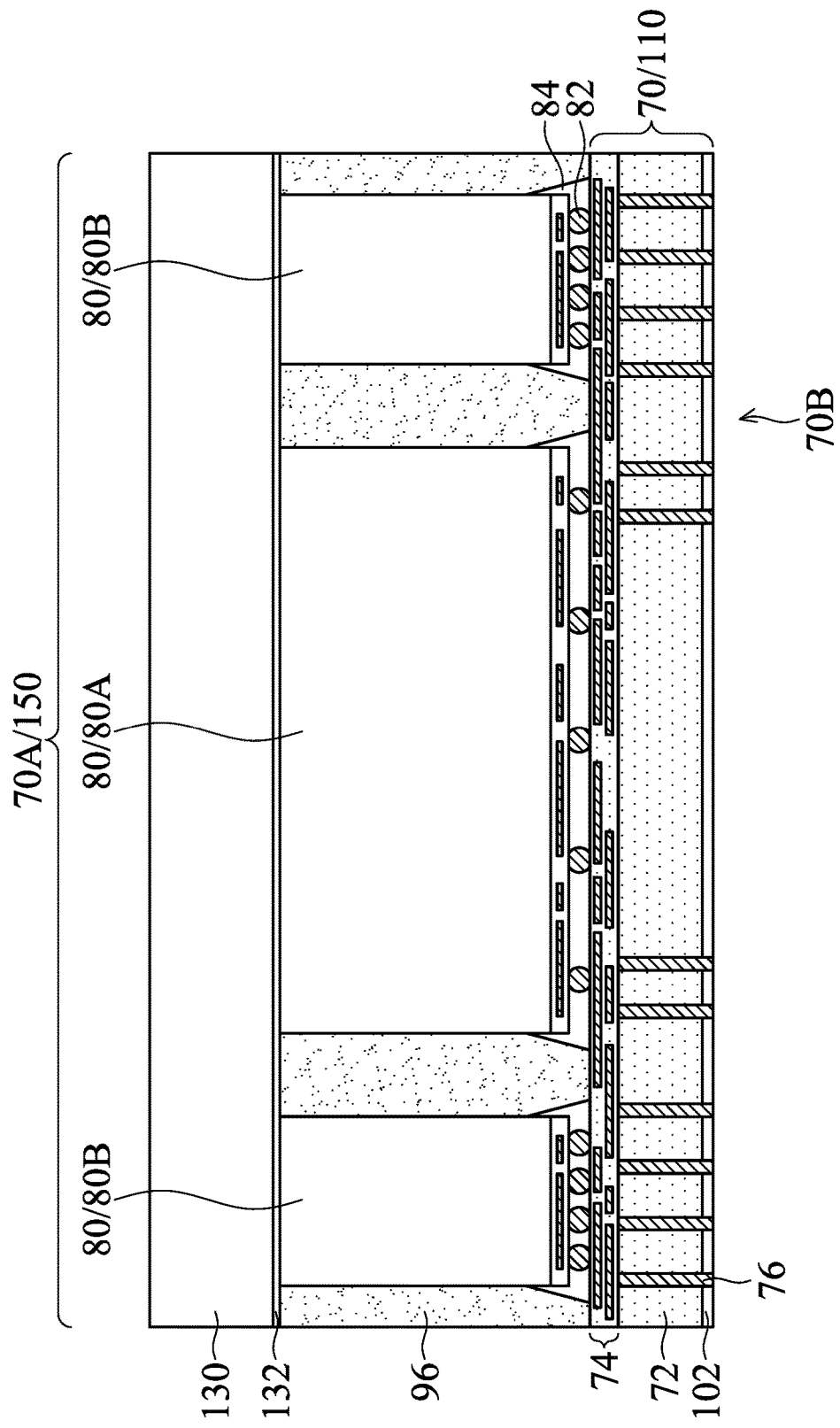

In FIG. 8, the substrate 72 is thinned to expose the conductive vias 76. Exposure of the conductive vias 76 may be accomplished by a thinning process, such as a grinding process, a chemical-mechanical polish (CMP), an etch-back, combinations thereof, or the like. In the illustrated embodiment, a recessing process is performed to recess the back surface of the substrate 72 such that the conductive vias 76 protrude at the back side 70B of the wafer 70. The recessing process may be, e.g., a suitable etch-back process, chemical-mechanical polish (CMP), or the like. In some embodiments, the thinning process for exposing the conductive vias 76 includes a CMP, and the conductive vias 76 may protrude at the back side 70B of the wafer 70 as a result of dishing that occurs during the CMP. An insulating layer 102 is optionally formed on the back surface of the substrate 72, surrounding the protruding portions of the conductive vias 76. In some embodiments, the insulating layer 102 is formed of a silicon-containing insulator, such as, silicon nitride, silicon oxide, silicon oxynitride, or the like, and may be formed by a suitable deposition method such as spin coating, CVD, plasma-enhanced CVD (PECVD), high density plasma CVD (HDP-CVD), or the like. Initially, the insulating layer 102 may bury the conductive vias 76. A removal process can be applied to the various layers to remove excess materials over the conductive vias 76. The removal process may be a planarization process such as a chemical mechanical polish (CMP), an etch-back, combinations thereof, or the like. After planarization, the exposed surfaces of the conductive vias 76 and the insulating layer 102 are substantially coplanar (within process variations) and are exposed at the back side 70B of the wafer 70. In some embodiments, the insulating layer 102 is omitted, and the exposed surfaces of the substrate 72 and the conductive vias 76 are substantially coplanar (within process variations).

Figure 9:
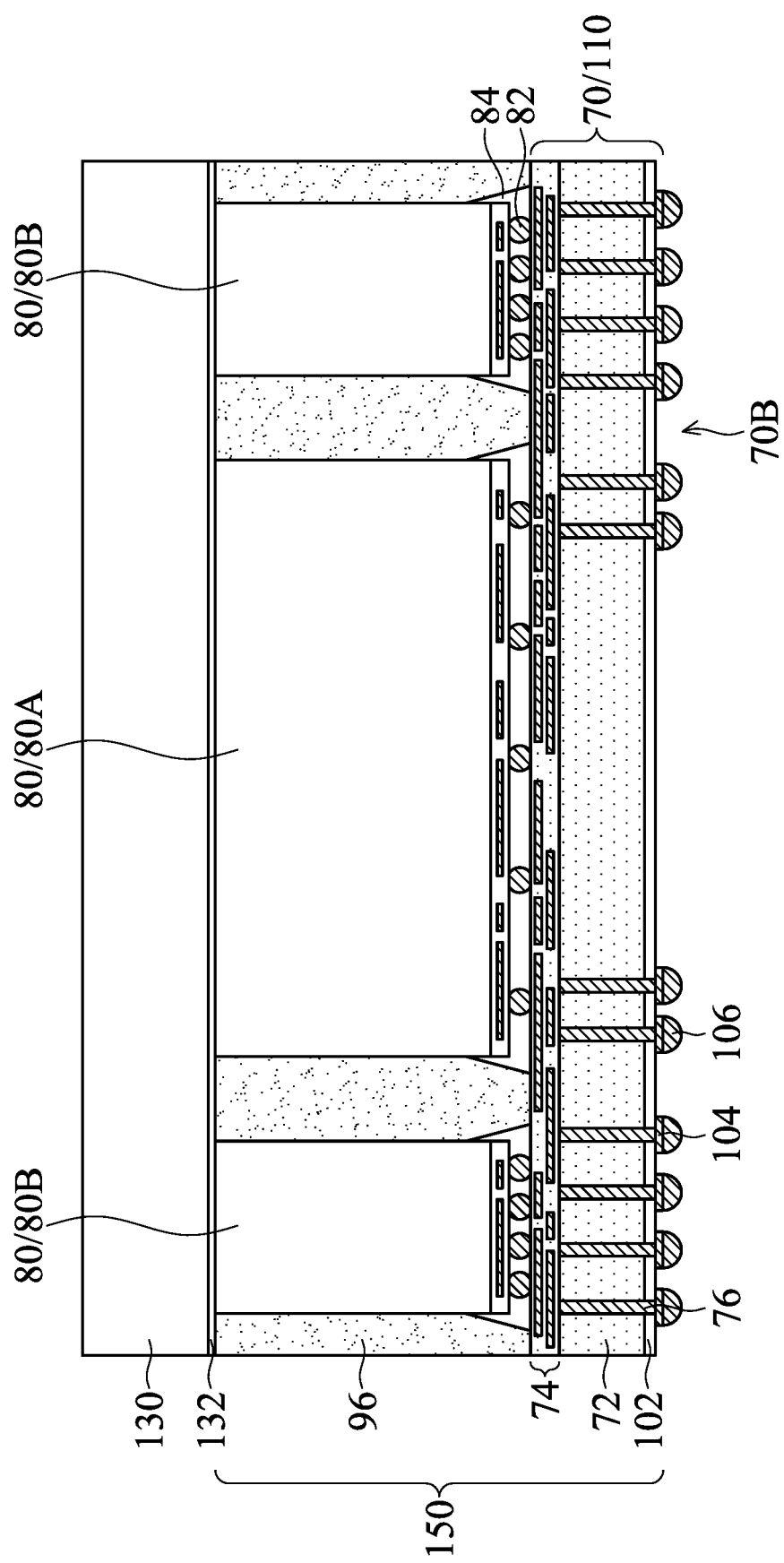

In FIG. 9, under bump metallurgies (UBMs) 104 are formed on the exposed surfaces of the conductive vias 76 and the insulating layer 102 (or the substrate 72, when the insulating layer 102 is omitted). As an example to form the UBMs 104, a seed layer (not separately illustrated) is formed over the exposed surfaces of the conductive vias 76 and the insulating layer 102 (if present) or the substrate 72. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 104. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 104.

Further, conductive connectors 106 are formed on the UBMs 104. The conductive connectors 106 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 106 may be formed of a conductive material that is reflowable, such as solder, copper, aluminum, gold, nickel, silver, palladium, tin, the like, or a combination thereof. In some embodiments, the conductive connectors 106 are formed by initially forming a layer of solder through evaporation, electroplating, printing, solder transfer, ball placement, or the like. Once a layer of solder has been formed on the structure, a reflow may be performed in order to shape the material into desired bump shapes. In another embodiment, the conductive connectors 106 comprise metal pillars (such as copper pillars) formed by sputtering, printing, electro plating, electroless plating, CVD, or the like. The metal pillars may be solder-free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Optionally, a singulation process may be performed to singulate the package component 150. For example, the singulation process is performed by cutting along scribe line regions, e.g., around the package region 70A. The singulation process may include sawing, dicing, or the like. The singulation process may include sawing the insulating layer 102, the encapsulant 96, the interconnect structure 74, and the substrate 72. In some embodiments, the singulation process also includes sawing through the package carrier 130 and the release layer 132. The singulation process singulates the package region 70A from adjacent package regions. The resulting, singulated package component 150 is from the package region 70A. The singulation process forms interposers 110 from the singulated portions of the wafer 70. As a result of the singulation process, the outer sidewalls of the interposer 110 and the encapsulant 96 are substantially laterally coterminous (within process variations).

FIGS. 10-13 illustrate a bonding process used to attach the package component 150 to a package substrate 200 as part of the assembly of the integrated circuit package 250. Prior to bonding, the package component 150 will be temporarily attached to the package carrier 130 and the package substrate 200 will be temporarily attached to a substrate carrier 220. The remainder of the bonding process may then proceed with each of the components held more firmly in place with their respective carriers.

Figure 10:
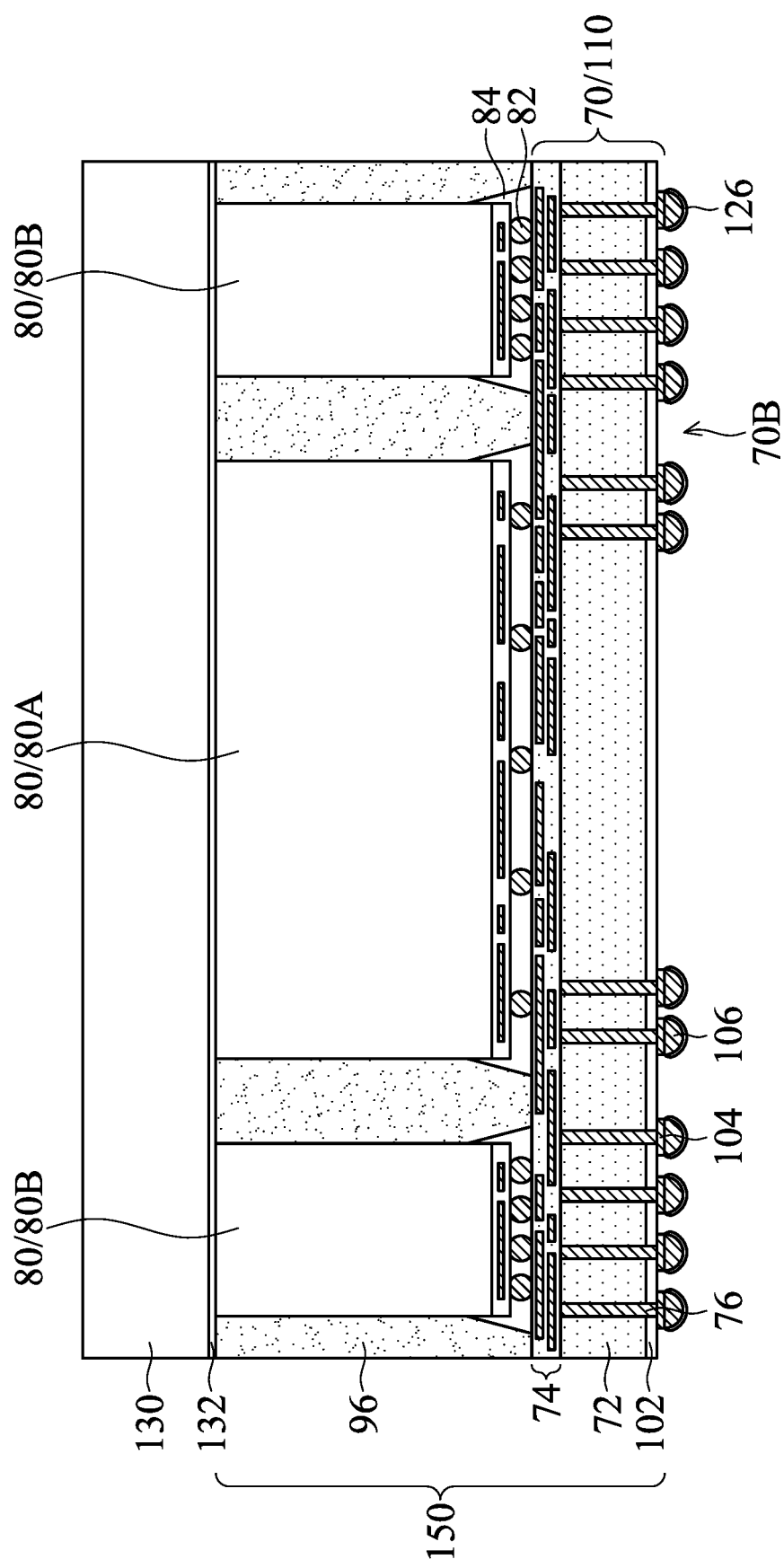

In FIG. 10, a flux 126 may be applied to the conductive connectors 106 of the package component 150. The flux 126 may also be applied to portions of the UBMs 104 proximal to the conductive connectors 106. In some embodiments, the flux 126 is applied in a flux dipping process, wherein the conductive connectors 106 of the package component 150 are dipped into a reservoir containing the flux 126 in liquid form, or using a jetting, spraying, brushing, syringe dispensing, atomizing the flux 126 onto the conductive connectors 106 or another dispensing process. For example, the flux 126 may be an epoxy, a polyimide, or other suitable material. In some embodiments, the flux 126 may act as a chemical cleaning agent that helps prevent or remove oxidation of the conductive connectors 106 and the UBMs 104 before and during the solder reflow process. Flux materials used for the flux 126 may fall into three broad categories: rosin fluxes, water-soluble fluxes, and no-clean fluxes. Rosin fluxes may be weakly acidic and soften at low temperatures (e.g., ranging from 60° C. to 70° C.) and become liquid at higher temperatures, for example, just above 100° C. Water-soluble fluxes may be composed of highly corrosive materials. No-clean fluxes are composed of materials that do not require removal following the bonding process. In accordance with some embodiments, the flux 126 comprises a suspension liquid of various acids suspended in an alcohol base. As illustrated, the flux 126 may form a layer around each of the conductive connectors 106. In some embodiments, the layer of the flux 126 may also form around portions of some of the UBMs 104.

Figure 11:
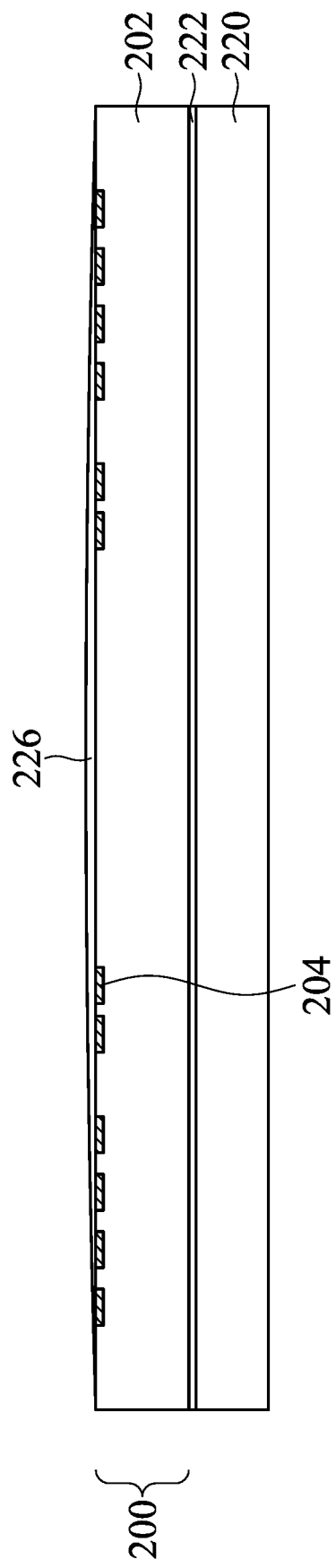

In FIG. 11, a package substrate 200 is provided and attached to a substrate carrier 220. The package substrate 200 may be provided already attached to the substrate carrier 220. In some embodiments, the package substrate 200 is temporarily bonded to the substrate carrier 220, and presence of the substrate carrier 220 during the subsequent bonding of the package component 150 (e.g., while attached to the package carrier 130) to the package substrate 200 to form the integrated circuit package 250 serves to reduce warpage or expansion that may otherwise occur in the package substrate 200 and/or the package component 150.

The package substrate 200 includes a substrate core 202, which may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, or the like, may also be used. Additionally, the substrate core 202 may be a SOI substrate. Generally, an SOI substrate includes a layer of a semiconductor material such as epitaxial silicon, germanium, silicon germanium, SOI, or combinations thereof. The substrate core 202 is, in an embodiment, an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate core 202.

The substrate core 202 may include active and passive devices (not separately illustrated). Devices such as transistors, capacitors, resistors, combinations thereof, and the like may be used to generate the structural and functional requirements of the design for the system. The devices may be formed using any suitable methods.

The substrate core 202 may also include metallization layers and vias (not separately illustrated) and bond pads 204 over the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material, and may be formed through any suitable process (such as deposition, damascene, dual damascene, or the like). In some embodiments, the substrate core 202 is substantially free of active and passive devices.

The substrate carrier 220 may be attached to the package substrate 200 by a release layer 222 along the package substrate 200. The release layer 222 may be formed of a polymer-based material, which may be removed along with the substrate carrier 220 from the package substrate 200 after processing. In some embodiments, the substrate carrier 220 is a substrate such as a bulk semiconductor or a glass substrate. In some embodiments, the release layer 222 is a laser- and/or thermal-release material, which loses its adhesive property when exposed to certain wavelengths of light and/or heated, such as a light-to-heat-conversion (LTHC) release coating. For example, the release layer 222 may comprise an epoxy, a polyimide, an acrylic, the like, in an acetate and/or alcohol solvent, for example, or a suitable material. For example, the release layer 222 may be formed from a mixture of an acrylic within a solvent of 1-methoxy-2-propyl acetate and 2-butoxy ethanol, as created by 3M™ for LTHC properties.

As discussed above, differing CTEs between the package substrate 200 and elements of the package component 150 (e.g., the integrated circuit devices 80, the encapsulant 96, and the wafer 70) may contribute to warpage during the bonding process. In some embodiments, the package substrate 200 may have an effective CTE ranging from 12 ppm/K to 20 ppm/K. For example, the substrate carrier 220 may be selected to have an effective CTE within the range of CTEs for the package substrate 200. In accordance with some embodiments, the substrate carrier 220 is selected to have an effective CTE within 10% to 40%, plus or minus, of the effective CTE of the package substrate 200. In other embodiments, the substrate carrier 220 is selected to have a CTE within up to 5%, plus or minus, of the package carrier 130. The CTE of the substrate carrier 220 is may be the same, similar, or different from the CTE of the package carrier 130. The CTE of the substrate carrier 220 may be within up to 50%, plus or minus of the CTE of the package carrier 130. In some embodiments, the effective CTE of the package substrate 200 is greater than the CTE of the substrate carrier 220, and the CTE of substrate carrier 220 may be similar to the CTE of the package carrier 130, such as being greater than the effective CTE of the package component 150.

Still referring to FIG. 11, a flux 226 may be applied over the bond pads 204 of the package substrate 200. In some embodiments, the flux 226 is applied to exposed surfaces of the package substrate 200 (e.g., the bond pads 204) using a jetting, spraying, or another dispensing process (e.g., any of the dispensing processes described above in connection with the flux 126). For example, the flux 226 may be any of the materials described above in connection with the flux 126, and the flux 226 may be a same or different material as the flux 126. In some embodiments, the flux 226 may act as a chemical cleaning agent that helps prevent oxidation of or remove oxidation (e.g., of native oxides) from the bond pads 204, the UBMs 104, and the conductive connectors 106 before and during the solder reflow process. The reduction or prevention of such oxidized portions improves reflow of the conductive connectors 106 and the bond pads 204, in accordance with some embodiments, to improve mixing and bonding between the conductive connectors 106 and the bond pads 204. The flux 226 may be formed to a thickness ranging from 1 µm to 1000 µm. As illustrated, the flux 226 may form a continuous region over the bond pads 204 and the substrate core 202. Although illustrated as having a greater thickness over a central region as compared to peripheral regions of the package substrate 200, in some embodiments, the flux 226 may have a same or consistent thickness over the central region and the peripheral regions. In some embodiments (not specifically illustrated), the flux 226 may be formed in discontinuous regions over one or more of the bond pads 204. In addition, in some embodiments (not specifically illustrated), only one of the flux 126 and the flux 226 is applied to the package component 150 or the package substrate 200, respectively.

Figure 12:
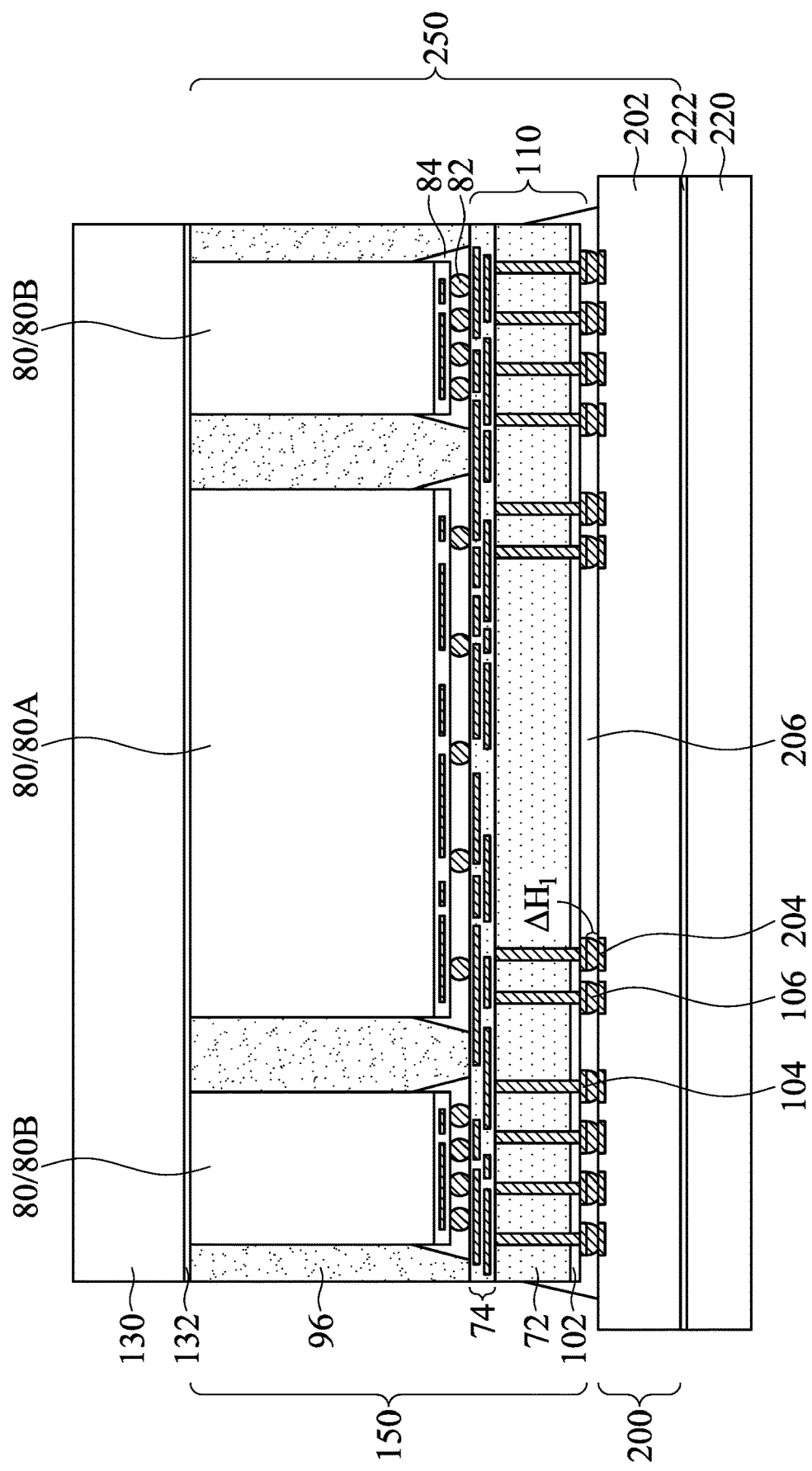

In FIG. 12, the package component 150 is bonded to the package substrate 200. In some embodiments, bonding the package component 150 to the package substrate 200 includes placing the package component 150 onto the package substrate 200 in the desired location, performing a thermal process and a cooling process to reflow and re-solidify the solder of the conductive connectors 106, optionally rinsing the flux 126 and the flux 226 from the structure, and forming an underfill 206 around the conductive connectors 106.

For example, the package component 150 may be placed onto the package substrate 200 with the conductive connectors 106 of the package component 150 aligned with corresponding bond pads 204 of the package substrate 200. The package component 150 may be placed on the package substrate 200 using, e.g., a pick-and-place tool. The flux 126 on the conductive connectors 106 of the package component 150 and the flux 226 on the bond pads 204 of the package substrate 200 assist in holding the package component 150 in place. As such, the position and orientation of the package component 150 over the package substrate 200 may be adjusted to a greater precision.

The conductive connectors 106 (e.g., solder) are then reflowed to attach the UBMs 104 to the bond pads 204. As discussed above, presence of the flux 126 and/or the flux 226 serves to hold the package component 150 in place over the package substrate 200 during the reflow process. The conductive connectors 106 connect the package component 150, including metallization layers of the interconnect structure 74, to the package substrate 200, including metallization layers in the substrate core 202. Thus, the package substrate 200 is electrically connected to the integrated circuit devices 80. In some embodiments, passive devices (e.g., surface mount devices (SMDs), not specifically illustrated) may be attached to the package component 150 (e.g., to the UBMs 104) prior to mounting the package component 150 onto the package substrate 200. In such embodiments, the passive devices may be attached to a same surface of the package component 150 as the conductive connectors 106. In some embodiments, passive devices (e.g., SMDs, not separately illustrated) may be attached to the package substrate 200 (e.g., to the bond pads 204).

To reflow the material of the conductive connectors 106 (e.g., solder), the package component 150 and the package substrate 200 may be heated to a suitable temperature for reflowing the material of the conductive connectors 106. In some embodiments, the conductive connectors 106 are heated to temperature ranging from 220° C. to 260° C., for a duration ranging from 0.01 seconds to 5 minutes. Upon reflowing, the conductive connectors 106 may form a larger area of physical contact with the bond pads 204. Afterward, the structure may be cooled to a suitable temperature for re-solidifying the conductive connectors 106. In some embodiments, the conductive connectors 106 are cooled to a temperature of less than or equal to 180° C. Optionally, the flux 126 and the flux 226 may be rinsed or removed from the structure using water and/or other suitable chemicals or heat. Flux removal (or cleaning) may involve spraying solvent, applying de-ionized (DI) water, heating, and drying the integrated circuit package 250, in accordance with some embodiments. In some embodiments, remaining portions of the flux 126 and the flux 226 may remain and act as an underfill.

Still referring to FIG. 12, in some embodiments, an underfill 206 is formed between the package component 150 and the package substrate 200, surrounding the conductive connectors 106 and the UBMs 104. The underfill 206 may be formed by a capillary flow process after the package component 150 is attached or may be formed by a suitable deposition method before the package component 150 is attached. The underfill 206 may be a continuous material extending from the package substrate 200 to the interposer 110 (e.g., the insulating layer 102) of the package component 150.

Figure 13:
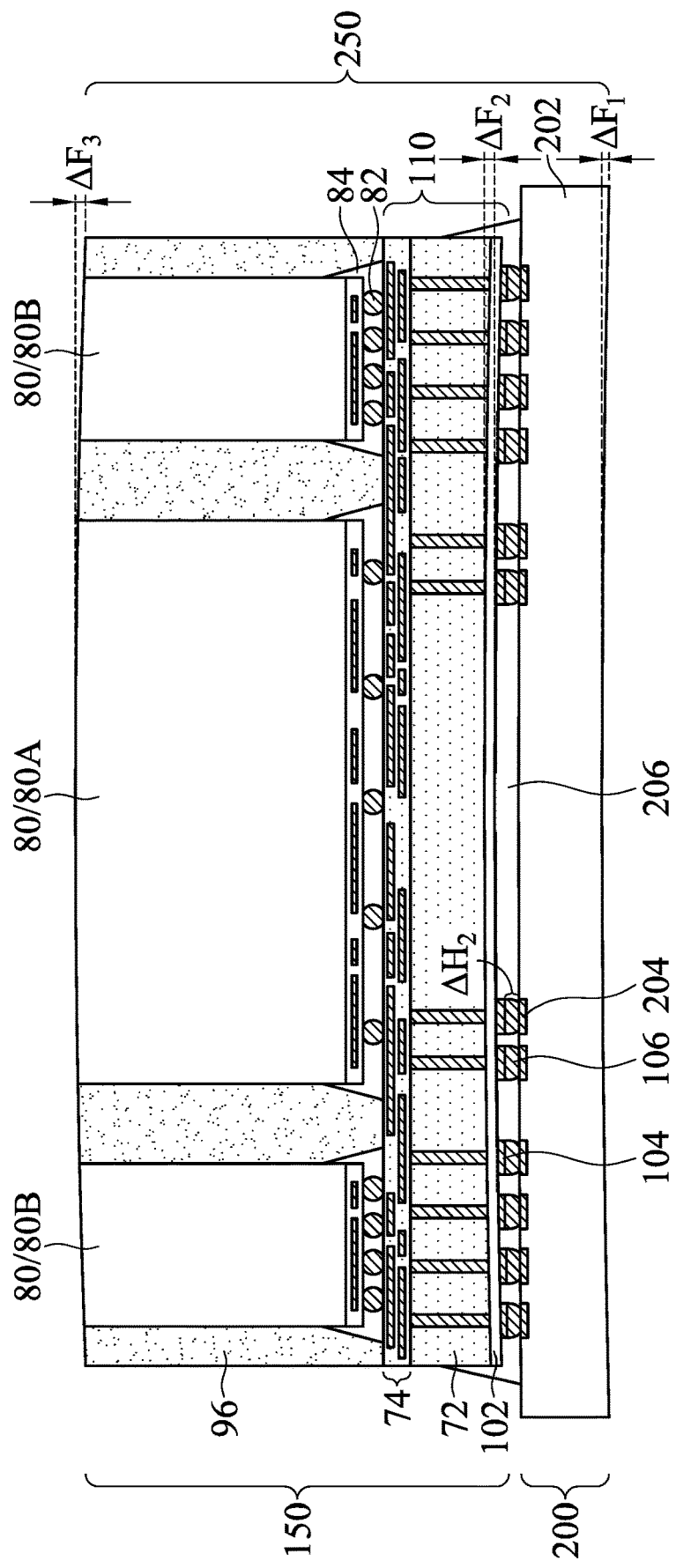

In FIG. 13, a carrier debonding process is performed to detach (debond) the package carrier 130 from the package component 150 (including the encapsulant 96, the first integrated circuit device 80A, and the second integrated circuit devices 80B), thereby completing formation of the integrated circuit package 250. In embodiments in which the package carrier 130 is attached to the package component 150 by a release layer 132, the debonding includes projecting a light such as a laser light or an ultraviolet (UV) light on the release layer 132 so that the release layer 132 decomposes under the heat of the light and the package carrier 130 can be removed. In embodiments in which the package carrier 130 is being held to the package component 150 by vacuum or pressure, releasing those forces will facilitate removal of the package carrier 130 from the package component 150.

In addition, a carrier debonding is performed to detach (debond) the substrate carrier 220 from the package substrate 200. In embodiments in which the substrate carrier 220 is attached to the package substrate 200 by a release layer 222, the debonding includes projecting a light such as a laser light or an ultraviolet (UV) light on the release layer 222 so that the release layer 222 decomposes under the heat of the light and the substrate carrier 220 can be removed. In embodiments in which the package substrate 200 is being held to the substrate carrier 220 by vacuum or pressure, releasing those forces will facilitate removal of the substrate carrier 220 from the package substrate 200.

Attaching the package carrier 130 and the substrate carrier 220 before the bonding process to form the integrated circuit package 250 may achieve various advantages. For example, the bonding process tends to cause warpage and expansion of the integrated circuit package 250 due, in part, to the package substrate 200 having relatively wide and flat dimensions. In addition, warpage and expansion may also be caused by the first integrated circuit device 80A, the second integrated circuit devices 80B, the encapsulant 96, and the package substrate 200 having a variety of CTEs, such as those discussed above. In particular, the bonding process includes one or more thermal processes, which may result in some of these components expanding by greater degrees than others of these components, for example, if the first integrated circuit device 80A, the second integrated circuit devices 80B, the encapsulant 96, the wafer 70, and/or the package substrate 200 have different CTEs from one another. Presence of the package carrier 130 and presence of the substrate carrier 220 serve to reduce warpage that may otherwise occur in the package substrate 200 and/or the package component 150. In particular, attaching the substrate carrier 220 and the package carrier 130 ensures that the package substrate 200 and the package component 150, respectively, remain flat and firmly held in position along the substrate carrier 220.

As illustrated, some warpage of the integrated circuit package 250 may be observed, whether before or after removing the package carrier 130 and the substrate carrier 220. However, as discussed above, attaching the package carrier 130 to the package component 150 and the substrate carrier 220 to the package substrate 200 for the bonding process reduces such warpage of the package component 150 and/or the package substrate 200. Variations in heights of the conductive connectors 106 (e.g., measured from the bond pads 204 to the UBMs 104) may indicate some degree of warpage or curvature in the integrated circuit package 250. For example, referring back to FIG. 12, before removing the package carrier 130 and the substrate carrier 220, the conductive connectors 106 may have a height variance $\Delta H_1$ between the shortest and tallest of less than or equal to 150 μm. Additional warpage or curvature may be measured after removing the package carrier 130 and/or the substrate carrier 220 due to no longer having one or both of those structures for support. As a result, referring again to FIG. 13, after removing the package carrier 130 and/or the substrate carrier 220, the conductive connectors 106 may have a height variance $\Delta H_2$ between the shortest and tallest of less than or equal to 10 μm. Note that, although the height variances may increase from $\Delta H_1$ to $\Delta H_2$ due to more warpage or curvature being measured, the presence of the package carrier 130 and the substrate carrier 220 during the bonding process reduced the warpage that may otherwise have been expected, thereby decreasing the amount of increase from $\Delta H_1$ to $\Delta H_2$.

Additional metrics may further indicate warpage or curvature in one or more portions of the integrated circuit package 250. Variations in the flatness of those portions may indicate some degree of warpage or curvature in the integrated circuit package 250. For example, a flatness variance $\Delta F_1$ of less than or equal to 50 µm may be measured in a bottom surface of the package substrate 200 (e.g., the substrate core 202). In addition, a flatness variance $\Delta F_2$ of less than or equal to 120 µm may be measured in a bottom surface of the interposer 110 (e.g., the substrate 72 and/or the insulating layer 102, if present). Further, a flatness variance $\Delta F_3$ of less than or equal to 120 µm may be measured in a top surface of the encapsulant 96. The presence of the package carrier 130 and the substrate carrier 220 during the bonding process reduces the flatness variances $\Delta F_1$, $\Delta F_2$, and $\Delta F_3$.

Although not specifically illustrated, the integrated circuit package 250 may undergo further processing, for example, after removing the package carrier 130 and, optionally, also after removing the substrate carrier 220. For example, additional structures may be attached to the package component 150, such as a heat spreader. In some embodiments, additional processing may include singulation of the package substrate 200.

Figure 14:
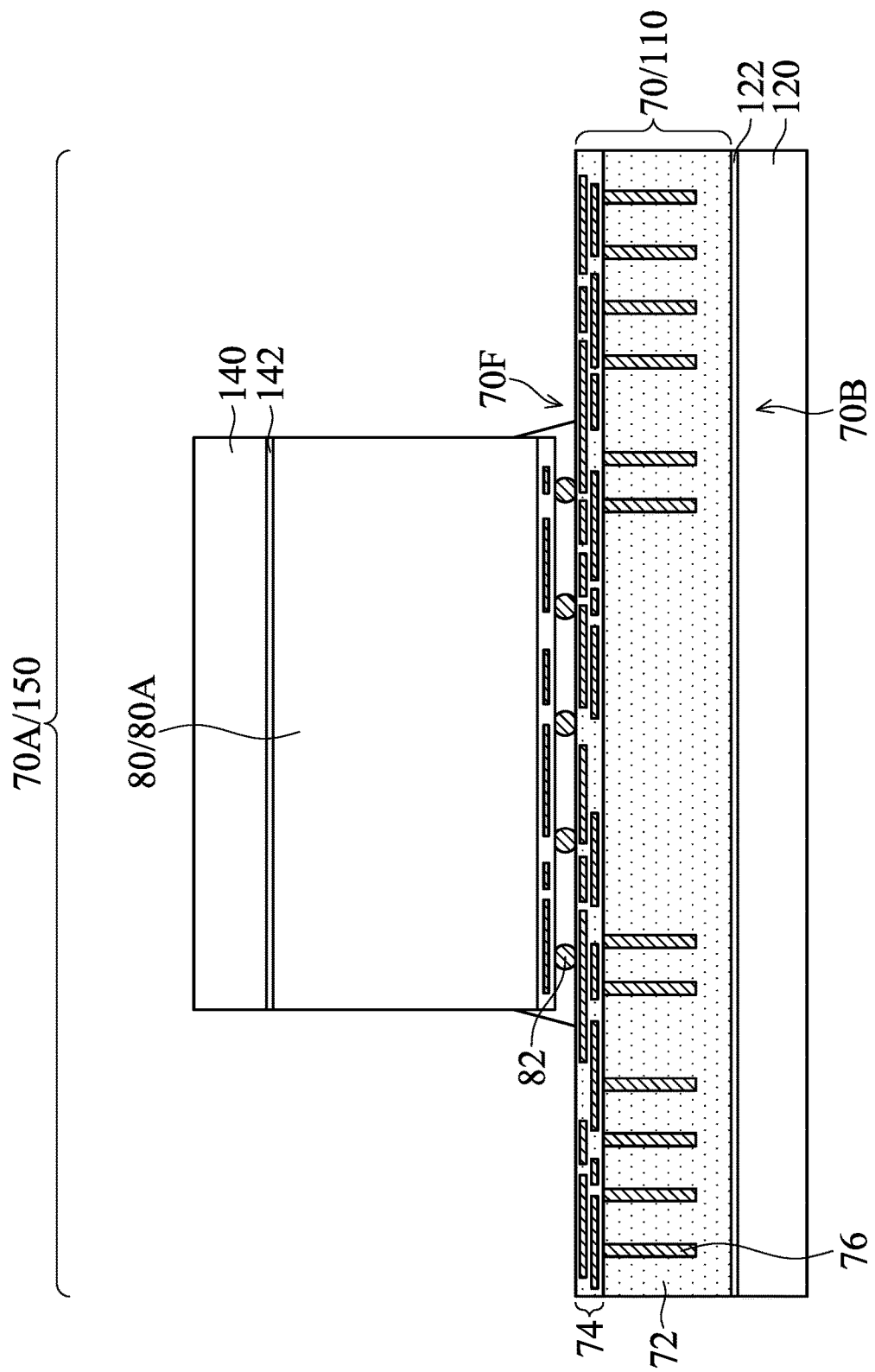
FIG. 14 is a cross-sectional view of an intermediate stage in the manufacturing of an integrated circuit package, in accordance with some other embodiments.

The carriers 130, 220 described above are utilized to reduce warpage when bonding a chip-on-wafer component (e.g., the package component 150) to a substrate (e.g., the package substrate 200) to form a CoWoS package. Carriers may be utilized in a similar manner in other types of flip-chip bonding processes. FIG. 14 is a cross-sectional view of an intermediate stage in the manufacturing of an integrated circuit package 250, in accordance with some embodiments. In this embodiment, carriers 120, 140 are utilized in a similar manner as the carriers 130, 220 when bonding an integrated circuit device 80 to a wafer 70 to form a chip-on-wafer component (e.g., the package component 150). After the processing step of FIG. 14, appropriate processing steps as described above may be performed to complete formation of an integrated circuit package 250.

In FIG. 14, formation of the package component 150 includes attaching a first integrated circuit device 80A to a chip carrier 140 to reduce warpage or expansion of the first integrated circuit device 80A when subsequently attaching the first integrated circuit device 80A to the wafer 70. For example, the chip carrier 140 may be attached to the first integrated circuit device 80A by a release layer 142. The release layer 142 may be formed of a polymer-based material, which may be removed along with the chip carrier 140 from the structure after processing. In some embodiments, the chip carrier 140 is a substrate such as a bulk semiconductor or a glass substrate. In some embodiments, the release layer 142 is a laser- and/or thermal-release material, which loses its adhesive property when exposed to certain wavelengths of light and/or heated, such as a light-to-heat-conversion (LTHC) release coating. For example, the release layer 142 may comprise an epoxy, a polyimide, an acrylic, the like, in an acetate and/or alcohol solvent, for example, or a suitable material. For example, the release layer 142 may be formed from a mixture of an acrylic within a solvent of 1-methoxy-2-propyl acetate and 2-butoxy ethanol, as created by 3M™ for LTHC properties. In some embodiments (not specifically illustrated), the first integrated circuit device 80A is held in place against the chip carrier 140 using a vacuum or pressure seal without the release layer 142.

Further, the wafer 70 is attached to a wafer carrier 120 to prevent or reduce warpage or expansion of the wafer 70 during subsequent processing steps. For example, the wafer carrier 120 may be attached to a back side 70B of the wafer 70 (e.g., the back side 70B being opposite of a front side 70F of the wafer 70) by a release layer 122. The release layer 122 may be formed of a polymer-based material, which may be removed along with the wafer carrier 120 from the structure after processing. In some embodiments, the wafer carrier 120 is a substrate such as a bulk semiconductor or a glass substrate. In some embodiments, the release layer 122 is a laser- and/or thermal-release material, which loses its adhesive property when exposed to certain wavelengths of light and/or heated, such as a light-to-heat-conversion (LTHC) release coating. For example, the release layer 122 may comprise an epoxy, a polyimide, an acrylic, the like, in an acetate and/or alcohol solvent, for example, or a suitable material. For example, the release layer 122 may be formed from a mixture of an acrylic within a solvent of 1-methoxy-2-propyl acetate and 2-butoxy ethanol, as created by 3M™ for LTHC properties. In some embodiments (not specifically illustrated), the wafer 70 is held in place against the wafer carrier 120 using a vacuum or pressure seal without the release layer 122.

After attaching the first integrated circuit device 80A to the chip carrier 140 and attaching the wafer 70 to a wafer carrier 120, the first integrated circuit device 80A is bonded to the wafer 70. Bonding the first integrated circuit device 80A to the wafer 70 may include placing the first integrated circuit device 80A on the wafer 70 and reflowing the conductive connectors 82. The chip carrier 140 and the wafer carrier 120 are then removed. The carriers 120, 140 may be removed using similar processes as those described for removing the carriers 130, 220 (see FIGS. 12-13).

Presence of the chip carrier 140 attached to the first integrated circuit device 80A and the wafer carrier 120 attached to the wafer 70 reduces warpage of the first integrated circuit device 80A during the bonding process. However, some warpage or curvature may be observed following the bonding process. For example, heights of the conductive connectors 82 may vary between the shortest and tallest by less than or equal to 15 µm. In addition, variations in the flatness of a top or bottom side of the first integrated circuit device 80A may be less than or equal to 60 µm.

Embodiments may achieve advantages. Attaching the carriers 130, 220 to the package component 150 and the package substrate 200 for the bonding process minimizes warpage that may occur in either component. In particular, varying coefficients of thermal expansion (CTEs) among the components coupled with heating and cooling processes to reflow and re-solidify solder material tends to cause elements within the package component 150 and/or the package substrate 200 to expand and contract by varying degrees. The stability provided by both carriers during the bonding process reduces the warpage that may otherwise occur. In addition, carriers may be used similarly during the bonding of one or more integrated circuit devices 80 to a wafer 70 in the formation of the package component 150 to achieve similar benefits. As a result of reducing warpage in these instances, the integrated circuit package 250 may be assembled with increase efficiency and perform with improved robustness and reliability.

In an embodiment, a method of forming an integrated circuit package includes: attaching a first carrier to a package component, the package component comprising: an interposer; a first semiconductor die attached to a first side of the interposer; a second semiconductor die attached to the first side of the interposer; an encapsulant encapsulating the first semiconductor die and the second semiconductor die; and conductive connectors attached to a second side of the interposer; attaching a second carrier to a package substrate, the package substrate comprising bond pads; bonding the conductive connectors of the package component to the bond pads of the package substrate by reflowing the conductive connectors while the first carrier is attached to the package component and while the second carrier is attached to the package substrate; removing the first carrier; and removing the second carrier. In another embodiment, after removing the first carrier and removing the second carrier, the conductive connectors have a height variance of less than 10 µm. In another embodiment, bonding the conductive connectors to the bond pads comprises: forming a first flux over the conductive connectors; forming a second flux over the bond pads; aligning the package component with the package substrate; and applying heat to reflow the conductive connectors. In another embodiment, the first semiconductor die, the second semiconductor die, and the encapsulant have different coefficients of thermal expansion. In another embodiment, a coefficient of thermal expansion of the second carrier is different from a coefficient of thermal expansion of the first carrier. In another embodiment, the method further includes: attaching a third carrier to the first semiconductor die; attaching a fourth carrier to the interposer; bonding the first semiconductor die to the interposer while the third carrier is attached to the first semiconductor die and while the fourth carrier is attached to the interposer; removing the third carrier; and removing the fourth carrier. In another embodiment, attaching the first carrier to the package component comprises temporarily bonding a first release layer along the first carrier to the package component. In another embodiment, the package substrate is attached to the second carrier using a vacuum seal.

In an embodiment, a method of forming an integrated circuit package includes: applying a first flux to conductive connectors of a package component, the package component being attached to a package carrier, the package component comprising: an interposer; a first semiconductor die bonded to the interposer; and a second semiconductor die bonded to the interposer and laterally adjacent to the first semiconductor die; applying a second flux to bond pads of a package substrate, the package substrate being attached to a substrate carrier; aligning the conductive connectors with the bond pads; and reflowing the conductive connectors, wherein after reflowing the conductive connectors, the conductive connectors have a height variance of less than or equal to 10 µm. In another embodiment, the method further includes, before aligning the conductive connectors to the bond pads: attaching the package component to the package carrier; and attaching the package substrate to the substrate carrier. In another embodiment, the method further includes, after reflowing the conductive connectors: removing the package carrier; and removing the substrate carrier. In another embodiment, the height variance of the conductive connectors increases upon removing the package carrier and removing the substrate carrier, and wherein the height variance is less than or equal to 10 µm after removing the package carrier and removing the substrate carrier. In another embodiment, the first semiconductor die comprises a logic die, and wherein the second semiconductor die comprises a memory die. In another embodiment, applying the first flux comprises dipping the package component into the first flux, and wherein applying the second flux comprises spraying or jetting the second flux onto the bond pads.

In another embodiment, the first semiconductor die and the second semiconductor die have different coefficients of thermal expansion.

In an embodiment, a method of forming an integrated circuit package includes: attaching semiconductor dies to a first side of an interposer; forming an encapsulant around the semiconductor dies; attaching a first carrier over the semiconductor dies and the encapsulant; thinning a second side of the interposer to expose conductive vias; forming conductive connectors over the conductive vias; bonding the conductive connectors to bond pads of a package substrate, the package substrate being attached to a second carrier during the bonding, wherein after bonding the conductive connectors, the conductive connectors have a first height variance; and removing the first carrier and the second carrier, wherein after removing the first carrier and the second carrier, the conductive connectors have a second height variance greater than the first height variance. In another embodiment, the second height variance is less than or equal to 10 µm. In another embodiment, a flatness variance of the interposer increases upon removing the first carrier and the second carrier. In another embodiment, the method further includes dipping the conductive connectors into a flux material. In another embodiment, bonding the conductive connectors comprises: placing the interposer onto the package substrate, the flux material being in contact with the bond pads; reflowing the conductive connectors; re-solidifying the conductive connectors; and depositing an underfill around the conductive connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit package, the method comprising:
    attaching a first carrier to a package component, the package component comprising:
        an interposer;
        a first semiconductor die attached to a first side of the interposer;
        a second semiconductor die attached to the first side of the interposer;
        an encapsulant encapsulating the first semiconductor die and the second semiconductor die; and
        conductive connectors attached to a second side of the interposer;
    attaching a second carrier to a package substrate, the package substrate comprising bond pads;
    bonding the conductive connectors of the package component to the bond pads of the package substrate by reflowing the conductive connectors while the first carrier is attached to the package component and while the second carrier is attached to the package substrate;
    removing the first carrier; and
    removing the second carrier.

2. The method of claim 1, wherein after removing the first carrier and removing the second carrier, the conductive connectors have a height variance of less than 10 µm.

3. The method of claim 1, wherein bonding the conductive connectors to the bond pads comprises:
forming a first flux over the conductive connectors;
forming a second flux over the bond pads;
aligning the package component with the package substrate; and
applying heat to reflow the conductive connectors.

4. The method of claim 1, wherein the first semiconductor die, the second semiconductor die, and the encapsulant have different coefficients of thermal expansion.

5. The method of claim 1, wherein a coefficient of thermal expansion of the second carrier is different from a coefficient of thermal expansion of the first carrier.

6. The method of claim 1 further comprising:
attaching a third carrier to the first semiconductor die;
attaching a fourth carrier to the interposer;
bonding the first semiconductor die to the interposer while the third carrier is attached to the first semiconductor die and while the fourth carrier is attached to the interposer;
removing the third carrier; and
removing the fourth carrier.

7. The method of claim 1, wherein attaching the first carrier to the package component comprises temporarily bonding a first release layer along the first carrier to the package component.

8. The method of claim 1, wherein the package substrate is attached to the second carrier using a vacuum seal.

9. A method of forming an integrated circuit package, the method comprising:
applying a first flux to conductive connectors of a package component, the package component being attached to a package carrier, the package component comprising:
an interposer;
a first semiconductor die bonded to the interposer; and
a second semiconductor die bonded to the interposer and laterally adjacent to the first semiconductor die;
applying a second flux to bond pads of a package substrate, the package substrate being attached to a substrate carrier;
aligning the conductive connectors with the bond pads; and
reflowing the conductive connectors, wherein after reflowing the conductive connectors, the conductive connectors have a height variance of less than or equal to 10 µm.

10. The method of claim 9 further comprising, before aligning the conductive connectors to the bond pads:
attaching the package component to the package carrier; and
attaching the package substrate to the substrate carrier.

11. The method of claim 10 further comprising, after reflowing the conductive connectors:
removing the package carrier; and
removing the substrate carrier.

12. The method of claim 11, wherein the height variance of the conductive connectors increases upon removing the package carrier and removing the substrate carrier, and wherein the height variance is less than or equal to 10 µm after removing the package carrier and removing the substrate carrier.

13. The method of claim 9, wherein the first semiconductor die comprises a logic die, and wherein the second semiconductor die comprises a memory die.

14. The method of claim 9, wherein applying the first flux comprises dipping the package component into the first flux, and wherein applying the second flux comprises spraying or jetting the second flux onto the bond pads.

15. The method of claim 9, wherein the first semiconductor die and the second semiconductor die have different coefficients of thermal expansion.

16. A method of forming an integrated circuit package, the method comprising:
attaching semiconductor dies to a first side of an interposer;
forming an encapsulant around the semiconductor dies;
attaching a first carrier over the semiconductor dies and the encapsulant;
thinning a second side of the interposer to expose conductive vias;
forming conductive connectors over the conductive vias;
bonding the conductive connectors to bond pads of a package substrate, the package substrate being attached to a second carrier during the bonding, wherein after bonding the conductive connectors, the conductive connectors have a first height variance; and
removing the first carrier and the second carrier, wherein after removing the first carrier and the second carrier, the conductive connectors have a second height variance greater than the first height variance.

17. The method of claim 16, wherein the second height variance is less than or equal to 10 µm.

18. The method of claim 16, wherein a flatness variance of the interposer increases upon removing the first carrier and the second carrier.

19. The method of claim 16 further comprising dipping the conductive connectors into a flux material.

20. The method of claim 19, wherein bonding the conductive connectors comprises:
placing the interposer onto the package substrate, the flux material being in contact with the bond pads;
reflowing the conductive connectors;
re-solidifying the conductive connectors; and
depositing an underfill around the conductive connectors.

* * * * *